US008961836B2

(12) United States Patent
Kleine Jaeger et al.

(10) Patent No.: US 8,961,836 B2
(45) Date of Patent: Feb. 24, 2015

(54) COMPOSITION FOR PRINTING CONDUCTOR TRACKS AND A PROCESS FOR PRODUCING SOLAR CELLS

(75) Inventors: Frank Kleine Jaeger, Bad Duerkheim (DE); Stephan Hermes, Bad Duerkheim (DE)

(73) Assignee: BASF SE, Ludwigshafen (DE)

( * ) Notice: Subject to any disclaimer, the term of this patent is extended or adjusted under 35 U.S.C. 154(b) by 353 days.

(21) Appl. No.: 13/394,008

(22) PCT Filed: Aug. 25, 2010

(86) PCT No.: PCT/EP2010/062404
§ 371 (c)(1),
(2), (4) Date: Mar. 2, 2012

(87) PCT Pub. No.: WO2011/026769
PCT Pub. Date: Mar. 10, 2011

(65) Prior Publication Data
US 2012/0164777 A1   Jun. 28, 2012

(30) Foreign Application Priority Data

Sep. 4, 2009  (EP) ..................... 09169549

(51) Int. Cl.
| H01B 1/16 | (2006.01) |
| H01B 1/22 | (2006.01) |
| B05D 5/12 | (2006.01) |
| H01L 21/268 | (2006.01) |
| H01L 31/0224 | (2006.01) |

(52) U.S. Cl.
CPC .. *H01B 1/16* (2013.01); *H01B 1/22* (2013.01); *H01L 21/268* (2013.01); *H01L 31/022425* (2013.01); *Y02E 10/50* (2013.01)
USPC ............................. 252/514; 136/252; 427/554

(58) Field of Classification Search
CPC ........ H01B 1/16; H01B 1/11; H01L 31/0224; H01L 31/022425; H01L 35/14; H01L 35/24; H05K 1/092; B05D 3/06; B05D 5/12
USPC .................. 252/512–514; 136/252–256; 427/553–559
See application file for complete search history.

(56) References Cited

U.S. PATENT DOCUMENTS

| 8,721,931 | B2 * | 5/2014 | Konno ....................... 252/520.3 |
| 2006/0289055 | A1 | 12/2006 | Sridharan et al. |
| 2009/0001328 | A1 | 1/2009 | Konno et al. |
| 2009/0317940 | A1 | 12/2009 | Konno et al. |
| 2010/0078603 | A1 | 4/2010 | Konno et al. |
| 2011/0014492 | A1 | 1/2011 | Joshi et al. |
| 2011/0292159 | A1 | 12/2011 | Jaeger et al. |
| 2011/0298878 | A1 | 12/2011 | Kleine Jaeger et al. |
| 2011/0310205 | A1 | 12/2011 | Jaeger et al. |
| 2013/0234271 | A1 * | 9/2013 | Carroll et al. ................. 257/431 |

FOREIGN PATENT DOCUMENTS

| EP | 1560227 A1 * | 8/2005 |
| EP | 1 775 759 | 4/2007 |
| EP | 1 887 106 | 2/2008 |
| WO | 2006 132766 | 12/2006 |
| WO | 2007 089273 | 8/2007 |
| WO | 2010 069902 | 6/2010 |

OTHER PUBLICATIONS

U.S. Appl. No. 13/380,259, filed Feb. 16, 2012, Kleine Jaeger, et al.
U.S. Appl. No. 13/391,779, filed Feb. 22, 2012, Kleine Jaeger, et al.
U.S. Appl. No. 13/394,011, filed Mar. 2, 2012, Klein Jaeger, et al.
International Search Report Issued Feb. 4, 2011 in PCT/EP10/62404 Filed Aug. 25, 2010.

* cited by examiner

*Primary Examiner* — Mark Kopec
(74) *Attorney, Agent, or Firm* — Oblon, Spivak, McClelland, Maier & Neustadt, L.L.P.

(57) ABSTRACT

The invention relates to a composition for printing conductor tracks onto a substrate, especially for solar cells, using a laser printing process, which composition comprises 30 to 90% by weight of electrically conductive particles, 0 to 7% by weight of glass frit, 0 to 8% by weight of at least one matrix material, 0 to 8% by weight of at least one organometallic compound, 0 to 5% by weight of at least one additive and 3 to 69% by weight of solvent. The composition further comprises 0.5 to 15% by weight of nanoparticles as absorbents for laser radiation, which nanoparticles are particles of silver, gold, platinum, palladium, tungsten, nickel, tin, iron, indium tin oxide, titanium carbide or titanium nitride. The composition comprises not more than 1% by weight of elemental carbon.

19 Claims, No Drawings

COMPOSITION FOR PRINTING CONDUCTOR TRACKS AND A PROCESS FOR PRODUCING SOLAR CELLS

The invention relates to a composition for printing conductor tracks onto a substrate, especially for solar cells, using a laser printing process, which composition comprises 30 to 90% by weight of electrically conductive particles, 0 to 7% by weight of glass frit, 0 to 8% by weight of at least one matrix material, 0 to 8% by weight of at least one organometallic compound, 0 to 5% by weight of at least one additive and 3 to 50% by weight of solvent. The invention further relates to a process for producing solar cells, in which a corresponding composition is printed onto a semiconductor substrate, by transferring the composition from a carrier by irradiation with a laser onto the semiconductor substrate.

In order to be able to print the composition onto the substrate by a laser printing process, the composition must comprise an absorbent for laser radiation, which absorbs the energy of the laser radiation and converts it to heat.

Absorbents currently used in inks for laser printing are, for example, carbon black or carbon nanotubes. These, however, have the disadvantage that they react in the course of firing of the solar cells to give carbon dioxide which remains in gaseous form in the conductor tracks, which gives rise to pores in the conductor tracks, which can lower the conductivity. In order to prevent this, carbon black-free compositions are currently typically being used, which are processed by inkjet printing processes or by screen printing processes.

A composition in paste form which can be used to produce a light-receiving surface electrode of a solar cell is described, for example, in WO 2007/089273. The paste comprises silver particles with a specific surface area of 0.2 to 0.6 m$^2$/g, glass frit, resin binder and diluent.

A composition which comprises silver powder with two different mean diameters is described in EP-A 1 775 759. In addition to the silver powder, the composition likewise comprises glass frit and an organic carrier. The proportion of silver in the electrode material is 75 to 95% by weight.

A further paste for producing electrodes for solar cells, which comprises 85 to 99% by weight of a conductive metal component and 1 to 15% by weight of a glass component, based in each case on the solid material, and an organic component, is described in WO 2006/132766.

None of the compositions described can be used for printing by laser printing. The use of a laser printing process, however, has the advantage over inkjet printing processes and screen printing processes that finer lines and hence finer electrodes can be printed onto the solar cell.

It is an object of the present invention to provide a composition for printing electrodes for solar cells, which is printable by laser printing, and in which, compared to known compositions, no reduction in the conductivity results from the firing.

The object is achieved by a composition for printing conductor tracks onto a substrate, especially for solar cells, using a laser printing process, which composition comprises 30 to 90% by weight of electrically conductive particles, 0 to 7% by weight of glass frit, 0 to 8% by weight of at least one matrix material, 0 to 8% by weight of at least one organometallic compound, 0 to 5% by weight of at least one additive and 3 to 69% by weight of solvent, wherein the composition further comprises 0.5 to 15% by weight of nanoparticles as absorbents for laser radiation, which nanoparticles are particles of silver, gold, platinum, palladium, tungsten, nickel, tin, bismuth, iron, indium tin oxide (ITO), tungsten oxide, titanium carbide or titanium nitride, and the composition comprises not more than 1% by weight of elemental carbon.

Nanoparticles in the context of the present invention are understood to mean particles with a particle size in the range from 1 to 800 nm. Nanoparticles used as absorbents typically have a particle size in the range from 3 to 800 nm.

The proportion of elemental carbon in the composition is not more than 1% by weight, preferably not more than 0.5% by weight, more preferably not more than 0.3% by weight and especially not more than 0.1% by weight. In one embodiment, no elemental carbon is present in the composition.

It has been found that, surprisingly, it is also possible to use nanoparticles of silver, gold, platinum, palladium, tungsten, nickel, tin, bismuth, iron, indium tin oxide, tungsten oxide, titanium carbide or titanium nitride as absorbents for laser radiation. In this way, it is possible to dispense with elemental carbon, for example in the form of carbon black, carbon nanotubes, graphenes or graphite, as an absorbent for laser radiation, or to significantly reduce the amount required compared to known compositions.

A further advantage of the use of silver, gold, platinum, palladium, tungsten, nickel, tin, iron, bismuth, indium tin oxide or titanium carbide is that these materials are electrically conductive. For this reason, the use of the nanoparticles lowers the electrical conductivity of the printed conductor tracks to a very much lower degree or preferably not at all. In addition, these materials are not oxidized in the course of baking; more particularly, they do not give rise to any gaseous compounds which can lead to porosity of the conductor tracks and hence to a lowering of the conductivity. Titanium carbide as an absorbent can burn, but the amount of carbon released is very much lower than the amount released in the case of elemental carbon as an absorbent.

A particularly preferred material for the nanoparticles is silver.

In one embodiment, the particles are spherical particles. Spherical particles in the context of the present invention means that the particles are essentially in spherical form, but the real particles may also have deviations from the ideal spherical form. For instance, the real particles may, for example, also be truncated or have a droplet shape. Other deviations from the ideal spherical shape, which can occur as a result of production, are also possible.

When the nanoparticles are spherical particles, they preferably have a diameter in the range from 2 to 100 nm. Especially in the case of use of infrared lasers, especially those with a wavelength of 1050 nm, it has been found that spherical nanoparticles with a particle diameter in the range from 2 to 50 nm are particularly suitable. The diameter of the spherical particles is more preferably in the region of 6 nm.

When the nanoparticles are used in the form of spherical particles, the proportion of the nanoparticles in the composition is especially in the range from 0.5 to 12% by weight.

In an alternative embodiment, the nanoparticles are prisms with an edge length in the range from 15 to 1000 nm and a height of 3 to 100 nm. The form of the prisms is variable. For instance, the form depends, among other factors, on the laser radiation used. The base of the prisms may, for example, be in the form of any polygon, for example of a triangle or of a pentagon. The prisms used as nanoparticles are generally plasmon resonators whose absorption behavior is matched to the wavelength of the laser used. The matching to the wavelength of the laser used is effected, for example, by the edge length of the prisms and by the cross-sectional area. For example, different cross-sectional areas and different edge lengths each have a different absorption behavior. The height of the prisms also exerts an influence on the absorption behavior.

When prisms are used as nanoparticles, the proportion of the nanoparticles present as prisms in the composition is preferably in the range from 3 to 10% by weight.

In addition to the use of spherical particles or prisms as absorbents for laser radiation, it is alternatively also possible that both spherical particles and prisms are used. Any desired ratio of spherical particles to prisms is possible. The greater the proportion of nanoparticles in the form of prisms, the lower the proportion of nanoparticles in the composition may be.

The nanoparticles are generally stabilized in the course of production, especially for transport, by suitable additives. In the course of preparation of the composition for printing conductor tracks, the additives are typically not removed, such that they are then also present in the composition. The proportion of additives for stabilization is generally not more than 15% by weight, based on the mass of nanoparticles. The additives used to stabilize the nanoparticles may, for example, be long-chain amines, for example dodecylamine. Further additives suitable for stabilizing the nanoparticles are, for example, octylamine, decylamine, oleic acid and polyethyleneimines.

The electrically conductive particles present in the composition may be particles of any geometry composed of any electrically conductive material. The electrically conductive particles present in the composition preferably comprise silver, gold, aluminum, platinum, palladium, tin, nickel, cadmium, gallium, indium, copper, zinc, iron, bismuth, cobalt, manganese, chromium, vanadium, titanium or mixtures or alloys thereof.

The mean particle size of the particles used is preferably in the range from 100 nm to 100 μm. The mean particle size is more preferably in the range from 500 nm to 50 μm and especially in the range from 500 nm to 10 μm. The particles used may have any desired form known to those skilled in the art. For example, the particles may be in platelet form or spherical form. Spherical particles are also understood to mean those whose real form deviates from the ideal spherical form. For example, spherical particles, as a result of the production, may also have a droplet shape or be truncated. Suitable particles which can be used to produce the composition are known to those skilled in the art and are commercially available. Especially preferably, spherical silver particles are used. The advantage of the spherical particles is their improved rheological behavior compared to platelet-shaped particles. For instance, a composition which comprises spherical particles has a lower viscosity than a composition comprising platelet-shaped particles. In addition, a composition which comprises spherical particles has a significant lowering of viscosity on shearing. This also allows high fill levels of up to about 90% to be achieved, in the case of which the composition still remains printable.

If two or more different types of electrically conductive particles are to be used, this can be done by mixing the types. The particles of the different types may differ in material, in form and/or in size.

The proportion of electrically conductive particles in the composition is in the range from 50 to 90% by weight. The proportion is preferably in the range from 70 to 87% by weight and especially in the range from 75 to 85% by weight.

In addition to the use of electrically conductive particles which have a size in the range from 100 nm to 100 μm, it is also possible to use nanoparticles as the electrically conductive particles. When the electrically conductive particles used are nanoparticles, they preferably have a mean diameter in the range from 1 to 500 nm. The nanoparticles may be in any desired form. For example, the nanoparticles may likewise be spherical particles or may be present in the form of prisms. More particularly, where nanoparticles are used as electrically conductive particles, the nanoparticles simultaneously also serve as absorbents for the laser radiation.

In order to obtain a printable composition, it is additionally necessary that the composition comprises a solvent. The proportion of solvent in the composition is generally in the range from 3 to 69% by weight. The proportion of solvent is preferably in the range from 5 to 20% by weight and especially in the range from 8 to 15% by weight.

The solvents used may, for example, be organic solvents. Suitable organic solvents are all solvents known to those skilled in the art. Preference is given to terpineol, texanol, ethylene glycol, propylene glycol and dipropylene glycol.

In addition to the use of organic solvents, it is also possible to use water as a solvent. When water is used as a solvent, the proportion of water is preferably in the range from 3 to 40% by weight, more preferably in the range from 5 to 15% by weight and especially in the range from 6 to 12% by weight.

Since water generally evaporates relatively rapidly, when water is used as a solvent, the addition of a retention aid, a so-called retardant, is necessary in order to slow the evaporation. The retention aid is present in the composition with a proportion of 0.5 to 50% by weight, preferably with a proportion of 5 to 40% by weight and especially with a proportion in the range from 10 to 30% by weight.

Suitable retention aids are polar, water-binding solvents. Suitable polar, water-binding solvents are, for example, glycerol, glycols, for example ethylene glycol, propylene glycol, polyglycols such as diethylene glycols, polyethylene glycols (for example PEG200), polypropylene glycol, alkanolamines, for example methyldiethanolamine, ethyldiethanolamine, N-methylpyrrolidone or polyethyleneimines, polyvinylamine or polyvinylformamide. Particularly preferred retention aids are glycerol or polyethylene glycols. These have a high surface tension, which reduces running of the composition on the surface of the substrate to be printed. As a result, clearer structures are printable.

In order to obtain a good bond of electrode structures printed with the composition on the semiconductor substrate in the production of solar cells, the semiconductor substrate also referred to as a wafer is fired with the structures printed thereon. In order that the composition adheres to the wafer before the firing, a matrix material is preferably additionally present. When a matrix material is present in the composition, the proportion of matrix material is preferably in the range from 0.1 to 8% by weight, more preferably in the range from 0.5 to 5% by weight and especially in the range from 1 to 3% by weight.

When water is used as the solvent, the matrix materials used are preferably water-soluble or water-dispersible polymers or polymer mixtures.

Preference is given to water-soluble or water-dispersible polymers or polymer mixtures which form low-viscosity solutions in water. This makes possible a high fill level on electrically conductive particles at low viscosity. Moreover, the polymers used should have a good adhesion to the substrate surface to be printed, for example in the production of solar cells of the surface of the solar wafer used. The polymers should also lead to a sufficient integrity of the printed conductor tracks.

Suitable polymers which can be used as matrix material are, for example, acrylate dispersions and acrylate copolymers, for example styrene acrylates, alkali-soluble acrylate resins and copolymers thereof, maleic anhydride copolymers, for example styrene-maleic acid dispersions, alkyd resin dispersions, styrene-butadiene dispersions, cellulose derivatives, especially hydroxyalkylcelluloses, carboxyalkylcelluloses, polyester dispersions, polyvinyl alcohols, especially partly or fully hydrolyzed polyvinyl alcohols, hydrolyzed vinyl acetate copolymers, for example grafted polyethylene glycol-vinyl acetate copolymers, polyvinylpyrrolidone and vinylpyrrolidone copolymers, polyethyleneimines, polyvinylamine, polyvinylformamide, hyperbranched polycarbonates, polyglycols, polyurethane dispersions, proteins, for example casein. It is also possible for mixtures of two or more polymers to form the matrix material.

When the solvents used are only organic solvents, suitable matrix materials are, for example, ABS (Acrylonitrile-Butadiene-Styrene); ASA (Acrylonitrile-Styrene-Acrylate); acrylated acrylates; alkyd resins; alkylvinyl acetates; alkylene-vinyl acetate copolymers, especially methylene-vinyl acetate, ethylene-vinyl acetate, butylene-vinyl acetate; alkylene-vinyl chloride copolymers; amino resins; aldehyde and ketone resins; cellulose and cellulose derivatives, especially hydroxyalkylcellulose, cellulose esters such as acetates, propionates, butyrates, carboxyalkylcelluloses, cellulose nitrate; epoxy acrylates; epoxy resins; modified epoxy resins, for example bifunctional or polyfunctional bisphenol A or bisphenol F resins, polyfunctional epoxy novolac resins, brominated epoxy resins, cycloaliphatic epoxy resins; aliphatic epoxy resins, glycidyl ethers, vinyl ethers, ethylene-acrylic acid copolymers; hydrocarbon resins; MABS (transparent ABS comprising acrylate units); melamine resins, maleic anhydride copolymers; methacrylates; natural rubber; synthetic rubber; chlororubber; natural resins; rosins; shellac; phenol resins; phenoxy resins, polyesters; polyester resins such as phenyl ester resins; polysulfones; polyether sulfones; polyamides; polyimides; polyanilines; polypyrroles; polybutylene terephthalate (PBT); polycarbonate (for example Makrolon® from Bayer AG); polyester acrylates; polyether acrylates; polyethylene; polyethylenethiophenes; polyethylene naphthalates; polyethylene terephthalate (PET); polyethylene terephthalate glycol (PETG); polypropylene; polymethyl methacrylate (PMMA); polyphenylene oxide (PPO); polystyrenes (PS), polytetrafluoroethylene (PTFE); polytetrahydrofuran; polyethers (for example polyethylene glycol, polypropylene glycol), polyvinyl compounds, especially polyvinyl chloride (PVC), PVC copolymers, PVdC, polyvinyl acetate and the copolymers thereof, optionally partly hydrolyzed polyvinyl alcohol, polyvinyl acetals, polyvinyl acetates, polyvinylpyrrolidone, polyvinyl ethers, polyvinyl acrylates and methacrylates in solution and as a dispersion, and the copolymers thereof, polyacrylic esters and polystyrene copolymers, for example polystyrene-maleic anhydride copolymers; polystyrene (impact-modified or impact-unmodified); polyurethanes, uncrosslinked or crosslinked with isocyanates; polyurethane acrylates; styrene-acrylic copolymers; styrene-butadiene block copolymers (for example Styroflex® or Styrolux® from BASF AG, K-Resin™ from CPC); proteins, for example casein; styrene-isoprene block copolymers; triazine resins, bismaleimide-triazine resins (BT), cyanate ester resin (CE), allylated polyphenylene ether (APPE). In addition, mixtures of two or more polymers may form the matrix material.

In order to obtain good adhesion of the composition to the semiconductor material used as the substrate in the production of solar cells, a glass frit is present in the composition with a proportion in the range from 0.5 to 6% by weight. The proportion of glass frit is preferably in the range from 1.5 to 4% by weight and especially in the range from 2 to 3.5% by weight.

Preference is given to using essentially lead-free glass frits. Such glass frits are, for example, bismuth oxide-based glasses. Glass frits suitable for the composition comprise especially bismuth oxide, silicon oxide and/or tellurium oxide.

The proportion of tellurium oxide is preferably in the range from 0.01 to 10% by weight. The proportion of bismuth oxide is preferably in the range from 40 to 95% by weight. The proportion of bismuth oxide is more preferably in the range from 50 to 80% by weight and especially in the range from 60 to 75% by weight. The proportion of silicon oxide is preferably in the range from 0 to 30% by weight, especially in the range from 1 to 4% by weight.

In addition to bismuth oxide, silicon oxide and tellurium oxide, the glass frit may additionally comprise boron oxide. The proportion of boron oxide is preferably in the range from 0.1 to 10% by weight, especially in the range from 0.5 to 8% by weight and in a particularly preferred embodiment in the range from 1 to 4% by weight.

In addition to the oxides mentioned, the glass frit may comprise zinc oxide and/or aluminum oxide. The proportion of zinc oxide is in the range from 0 to 15% by weight and the proportion of aluminum oxide in the range from 0 to 3% by weight.

Further metal oxides which may be present in the glass frit are, for example, silver oxide ($Ag_2O$), antimony oxide ($Sb_2O_3$), germanium oxide ($GeO_2$), indium oxide ($In_2O_3$), phosphorus pentoxide ($P_2O_5$), vanadium pentoxide ($V_2O_5$), niobium pentoxide ($Nb_2O_5$) and tantalum pentoxide ($Ta_2O_5$). The proportion of $Ag_2O$, $P_2O_5$, $V_2O_5$, $Nb_2O_5$ and/or $Ta_2O_5$, which may be present in the glass frit is in each case in the range from about 0 to 8% by weight. The proportion of $In_2O_3$ and/or $Sb_2O_3$ in the glass frit is preferably in each case in the range from 0 to 5% by weight. In addition, the glass frit may comprise one or more alkali metal oxides, typically $Na_2O$, $Li_2O$ and/or $K_2O$. The proportion of alkali metal oxides in the glass frit is in each case in the range from 0 to 3% by weight. In addition, alkaline earth metal oxides may also be present in the glass frit. Alkaline earth metal oxides typically present are BaO, CaO, MgO and/or SrO. The proportion of alkaline earth metal oxides in the glass frit is in each case in the range from 0 to 8% by weight.

Essentially lead-free in the context of the present invention means that no lead is added to the glass frit and the proportion of lead in the glass frit is less than 1000 ppm.

In a preferred embodiment at least a part of the nanoparticles is enclosed in the glass of the glass frit. In this case it is preferred when the material of the nanoparticles is bismuth. When only a part of the nanoparticles is enclosed in the glass of the glass frit, the material of the nanoparticles enclosed may by the same as those of the nanoparticles not being enclosed. However, it is also possible, to use nanoparticles of different materials, wherein for example the nanopartikles being enclosed in the glass of the glass frit consist of an other material than the nanoparticles not being enclosed. Further, it is possible that nanoparticles from different materials are enclosed in the glass of the glass frit.

The inventive composition further comprises at least one organometallic compound. The proportion of the organometallic compound in the composition is in the range from 0 to 5% by weight, preferably in the range from 1 to 3% by weight and especially in the range from 1.5 to 2.5% by weight.

In the course of firing of the substrate with the composition printed thereon, the organic constituent of the organometallic compound is decomposed and removed from the composition. The metal present remains in the composition.

Suitable organometallic compounds which can be used are metal carboxylates, metal propionates, metal alkoxides, complexes of a metal or a mixture thereof. The organometallic compounds may also comprise aromatic or aliphatic groups.

Suitable carboxylates are, for example, formates, acetates or propionates. Suitable alkoxides are, for example, methoxide, ethoxide, propoxide, butoxide, pentoxide, hexoxide, heptoxide, octoxide, nonoxide, decoxide, undecoxide and dodecoxide.

The metal of the organometallic compound is preferably selected from the group consisting of aluminum, bismuth, zinc and vanadium.

In addition, the organometallic compound may comprise boron or silicon.

Suitable organometallic compounds which can be used are, for example, bismuth(III) acetate, triphenylbismuth, bismuth (III) hexafluoropentanedionate, bismuth(III) tetramethylheptanedionate, bismuth neodecanoate, bismuth(III) 2-ethylhexanoate, bismuth carbonate oxide, bismuth subgallate hydrate, bismuth(III) gallate basic hydrate, bismuth(III) subsalicylate, bismuth(III) tris(2,2,6,6-tetramethyl-3,5-heptanedionate), triphenylbismuth(III) carbonate, tris(2-methoxyphenyl)bismuthine.

Especially preferred organometallic compounds are bismuth(III) acetate, bismuth(III) 2-ethylhexanoate, bismuth carbonate oxide, bismuth subgallate hydrate, bismuth(III) gallate basic hydrate, bismuth(III) subsalicylate.

In addition, the composition may also comprise further additives. Additives which may be present in the composition are, for example, dispersants, thixotropic agents, plasticizers, defoamers, desiccants, crosslinkers, complexing agents and/or conductive polymer particles. The additives may each be used individually or as a mixture of two or more of the additives.

The proportion of the additives in the composition is generally in the range from 0 to 5% by weight, preferably in the range from 0.1 to 3% by weight and especially in the range from 0.1 to 2% by weight.

When a dispersant is used as an additive, it is possible to use only one dispersant or more than one dispersant.

In principle, all dispersants which are known to the person skilled in the art for use in dispersions and are described in the prior art are suitable. Preferred dispersants are surfactants or surfactant mixtures, for example anionic, cationic, amphoteric or nonionic surfactants. Suitable cationic and anionic surfactants are described, for example, in "Encyclopedia of Polymer Science and Technology", J. Wiley & Sons (1966), Volume 5, pages 816 to 818 and in "Emulsion Polymerisation and Emulsion Polymers", Editors: P. Lovell and M. El-Asser, Publisher Wiley & Sons (1997), pages 224 to 226. However, it is also possible to use polymers with pigment-affinitive anchor groups, which are known to the person skilled in the art, as dispersants.

When thixotropic agents are added as an additive, it is possible, for example, to use organic thixotropic agents. Thickeners which can be used are, for example, polyacrylic acid, polyurethanes or hydrogenated castor oil.

Plasticizers, wetting agents, defoamers, desiccants, crosslinkers, complexing agents and conductive polymer particles which can be used are those as are typically used in dispersions and are known to the person skilled in the art.

The inventive composition is prepared, for example, by vigorous mixing and dispersion in units known to the person skilled in the art. This includes, for example, the mixing of the components in a dissolver or a unit which disperses with comparable intensity, dispersion in a stirred ball mill or a powder fluidizer in the case of production of large amounts.

The inventive composition is especially suitable for printing onto a substrate by a laser printing process.

In particular, the composition is suitable for producing solar cells.

To this end, the composition is printed onto a semiconductor substrate, by transferring the composition from a carrier by irradiation with a laser onto the semiconductor substrate, energy from the laser being absorbed by the nanoparticles and converted to heat, which evaporates solvent and propels a droplet of the composition from the carrier onto the semiconductor substrate.

This process enables precise production of conductor tracks on the semiconductor substrate. In production of solar cells, the semiconductor substrate is generally a silicon semiconductor. This is also referred to as a solar wafer.

The laser used in order to print the composition onto the semiconductor substrate is preferably an infrared laser. More particularly, the laser is an infrared laser with a wavelength of 1050 nm. It is possible here to use any desired infrared laser known to the person skilled in the art.

The invention claimed is:

1. A composition for printing conductor tracks onto a substrate using a laser printing process, the composition comprising:
    30 to 90% by weight of electrically conductive particles having a particle size of 100 nm to 100 μm,
    0 to 7% by weight of glass frit,
    0 to 8% by weight of a matrix material,
    0 to 8% by weight of an organometallic compound,
    0 to 5% by weight of an additive,
    3 to 69% by weight of a solvent,
    not more than 1% by weight of elemental carbon, and
    0.5 to 15% by weight of nanoparticles as absorbents for laser radiation, the nanoparticles comprising silver, gold, platinum, palladium, tungsten, nickel, tin, bismuth, iron, indium tin oxide, titanium carbide, tungsten oxide or titanium nitride, wherein the nanoparticles are prism-shaped nanoparticles having an edge length of 15 to 1000 nm and a height of 3 to 100 nm.

2. The composition of claim 1, further comprising 0.5 to 12% by weight of the spherical nanoparticles having a diameter of 2 to 100 nm.

3. The composition of claim 1, comprising prism-shaped nanoparticles that are plasmon resonators whose absorption behavior is matched to a wavelength of a laser used in a laser printing process.

4. The composition of claim 1, comprising 3 to 10% by weight of the prism-shaped nanoparticles.

5. The composition of claim 1, wherein the nanoparticles are stabilized by a long-chain amine.

6. The composition of claim 1, wherein at least some of the nanoparticles are enclosed in glass of the glass frit.

7. The composition of claim 1, wherein the electrically conductive particles comprise at least one element selected from the group consisting of silver, gold, aluminum, platinum, palladium, tin, nickel, cadmium, gallium, indium, copper, iron, bismuth, cobalt, manganese, chromium, vanadium, and titanium.

8. The composition of claim 1, wherein the glass frit comprises a bismuth oxide-based, lead-free glass.

9. The composition of claim 8, wherein the bismuth oxide-based lead-free glass comprises 0.01 to 10% by weight of tellurium oxide.

10. A process for producing a solar cell, comprising printing the composition of claim 1 onto a semiconductor substrate, by transferring the composition from a carrier by irradiation with a laser onto the semiconductor substrate, wherein energy of the laser is absorbed by the nanoparticles and converted to heat, which evaporates the solvent and propels a droplet of the composition from the carrier onto the semiconductor substrate.

11. The process of claim 10, wherein the laser is an infrared laser.

12. The process of claim 10, wherein the semiconductor substrate is a silicon semiconductor.

13. The composition of claim 1, comprising not more than 0.1% by weight of elemental carbon.

14. The composition of claim 1, wherein the nanoparticles comprise silver.

15. The composition of claim 1, further comprising spherical nanoparticles having a diameter of 2 to 100 nm.

16. The composition of claim 1, wherein the electrically conductive particles comprise silver.

17. The composition of claim 1, comprising 1 to 3% by weight of the matrix material.

18. The composition of claim 1, comprising 2 to 3.5% by weight of the glass frit.

19. The composition of claim 1, comprising 1.5 to 2.5% by weight of the organometallic compound.

\* \* \* \* \*